United States Patent
Liu et al.

(10) Patent No.: US 10,418,469 B2
(45) Date of Patent: Sep. 17, 2019

(54) INSULATED GATE BIPOLAR TRANSISTOR AND PREPARATION METHOD THEREFOR

(71) Applicant: ZHUZHOU CRRC TIMES ELECTRIC CO., LTD., Zhuzhou, Hunan (CN)

(72) Inventors: Guoyou Liu, Hunan (CN); Rongzhen Qin, Hunan (CN); Jianwei Huang, Hunan (CN); Haihui Luo, Hunan (CN); Xiaoping Dai, Hunan (CN)

(73) Assignee: ZHUZHOU CRRC TIMES ELECTRIC CO., LTD., Zhuzhou, Hunan (CN)

( * ) Notice: Subject to any disclaimer, the term of this patent is extended or adjusted under 35 U.S.C. 154(b) by 17 days.

(21) Appl. No.: 15/580,687

(22) PCT Filed: Jun. 22, 2016

(86) PCT No.: PCT/CN2016/086751
§ 371 (c)(1),
(2) Date: Dec. 8, 2017

(87) PCT Pub. No.: WO2017/080213
PCT Pub. Date: May 18, 2017

(65) Prior Publication Data
US 2018/0190805 A1    Jul. 5, 2018

(30) Foreign Application Priority Data
Nov. 10, 2015 (CN) .......................... 2015 1 0760338

(51) Int. Cl.
*H01L 29/739* (2006.01)
*H01L 29/40* (2006.01)
(Continued)

(52) U.S. Cl.
CPC .... *H01L 29/7397* (2013.01); *H01L 21/28061* (2013.01); *H01L 21/28114* (2013.01);
(Continued)

(58) Field of Classification Search
CPC ............... H01L 29/7428; H01L 29/407; H01L 29/7397; H01L 29/66348; H01L 29/6634;
(Continued)

(56) References Cited

U.S. PATENT DOCUMENTS 5,894,149 A    4/1999  Uenishi et al.
6,437,399 B1 *  8/2002  Huang ............... H01L 29/41716
                                                          257/329
(Continued)

FOREIGN PATENT DOCUMENTS

CN    101794813 A    8/2010
CN    102751329 A    10/2012
(Continued)

OTHER PUBLICATIONS

International Search Report for PCT/CN2016/086751, dated Sep. 19, 2016, ISA/CN.
(Continued)

*Primary Examiner* — Sophia T Nguyen
(74) *Attorney, Agent, or Firm* — Yue (Robert) Xu; Apex Attorneys at Law, LLP

(57) ABSTRACT

Provided are an insulated gate bipolar transistor and a preparation method therefor. An auxiliary groove gate, namely a structure of an auxiliary groove, an auxiliary gate layer and the corresponding gate oxide layer, is arranged below an emitting metal electrode between a first common groove and a second common groove so as to provide a carrier pathway when the insulated gate bipolar transistor is turned off, so that not only the turn-off speed of the insulated gate bipolar transistor is increased, but also the reverse-
(Continued)

biased safety operation area characteristic of the insulated gate bipolar transistor is improved, thus improving the performance of the insulated gate bipolar transistor.

10 Claims, 8 Drawing Sheets

(51) Int. Cl.
<table>
<tr><td>H01L 29/423</td><td>(2006.01)</td></tr>
<tr><td>H01L 29/417</td><td>(2006.01)</td></tr>
<tr><td>H01L 29/10</td><td>(2006.01)</td></tr>
<tr><td>H01L 29/08</td><td>(2006.01)</td></tr>
<tr><td>H01L 29/66</td><td>(2006.01)</td></tr>
<tr><td>H01L 21/8222</td><td>(2006.01)</td></tr>
<tr><td>H01L 21/04</td><td>(2006.01)</td></tr>
<tr><td>H01L 21/28</td><td>(2006.01)</td></tr>
<tr><td>H01L 29/06</td><td>(2006.01)</td></tr>
</table>

(52) U.S. Cl.
CPC ...... *H01L 29/0615* (2013.01); *H01L 29/0696* (2013.01); *H01L 29/0804* (2013.01); *H01L 29/0834* (2013.01); *H01L 29/1037* (2013.01); *H01L 29/404* (2013.01); *H01L 29/407* (2013.01); *H01L 29/41708* (2013.01); *H01L 29/4236* (2013.01); *H01L 29/4238* (2013.01); *H01L 29/42376* (2013.01); *H01L 29/6634* (2013.01); *H01L 29/66348* (2013.01); *H01L 21/0475* (2013.01); *H01L 21/8222* (2013.01)

(58) Field of Classification Search
CPC ............. H01L 29/0804; H01L 29/0834; H01L 29/404; H01L 29/4236; H01L 29/1037; H01L 29/42376; H01L 29/41708; H01L 21/28061; H01L 21/28114; H01L 21/049; H01L 21/0475; H01L 21/8222; H01L 29/4238; H01L 29/0696
See application file for complete search history.

(56) References Cited

U.S. PATENT DOCUMENTS

<table>
<tr><td>6,710,403 B2*</td><td>3/2004</td><td>Sapp ................ H01L 29/7813<br>257/330</td></tr>
<tr><td>6,781,200 B2*</td><td>8/2004</td><td>Ishimura ............ H01L 29/0696<br>257/329</td></tr>
<tr><td>7,449,762 B1*</td><td>11/2008</td><td>Singh ................ H01L 29/66522<br>257/493</td></tr>
<tr><td>7,498,634 B2*</td><td>3/2009</td><td>Tsuzuki ............. H01L 27/0664<br>257/133</td></tr>
<tr><td>7,504,306 B2*</td><td>3/2009</td><td>Sapp ................ H01L 29/0869<br>438/270</td></tr>
<tr><td>7,595,241 B2*</td><td>9/2009</td><td>Matocha ........... H01L 29/0634<br>438/268</td></tr>
<tr><td>7,691,711 B2*</td><td>4/2010</td><td>Stum ................ H01L 29/1095<br>438/268</td></tr>
<tr><td>8,829,641 B2*</td><td>9/2014</td><td>Marchant ........... H01L 29/0634<br>257/500</td></tr>
<tr><td>8,872,278 B2*</td><td>10/2014</td><td>Hao ................ H01L 29/4236<br>257/401</td></tr>
<tr><td>2002/0070418 A1*</td><td>6/2002</td><td>Kinzer ............. H01L 29/0634<br>257/496</td></tr>
<tr><td>2003/0042537 A1*</td><td>3/2003</td><td>Nakamura .......... H01L 29/402<br>257/328</td></tr>
<tr><td>2003/0141542 A1</td><td>7/2003</td><td>Ishimura et al.</td></tr>
<tr><td>2004/0041207 A1*</td><td>3/2004</td><td>Takano ............. H01L 29/7813<br>257/330</td></tr>
<tr><td>2005/0167742 A1*</td><td>8/2005</td><td>Challa ............ H01L 21/3065<br>257/328</td></tr>
<tr><td>2006/0214221 A1*</td><td>9/2006</td><td>Challa ............ H01L 21/3065<br>257/328</td></tr>
<tr><td>2007/0114570 A1</td><td>5/2007</td><td>Yamaguchi et al.</td></tr>
<tr><td>2007/0170511 A1*</td><td>7/2007</td><td>Huang ............. H01L 21/28061<br>257/355</td></tr>
<tr><td>2007/0210350 A1*</td><td>9/2007</td><td>Omura ............. H01L 23/4824<br>257/287</td></tr>
<tr><td>2008/0224207 A1</td><td>9/2008</td><td>Sakamoto et al.</td></tr>
<tr><td>2008/0265315 A1*</td><td>10/2008</td><td>Mauder ............ H01L 29/7813<br>257/330</td></tr>
<tr><td>2009/0140329 A1*</td><td>6/2009</td><td>Yoshimochi ....... H01L 29/4941<br>257/330</td></tr>
<tr><td>2010/0193835 A1*</td><td>8/2010</td><td>Hshieh ............ H01L 29/41708<br>257/139</td></tr>
<tr><td>2010/0193836 A1</td><td>8/2010</td><td>Okuno et al.</td></tr>
<tr><td>2011/0018029 A1*</td><td>1/2011</td><td>Pfirsch ............ H01L 29/0696<br>257/147</td></tr>
<tr><td>2012/0217513 A1*</td><td>8/2012</td><td>Tega ................ H01L 29/45<br>257/77</td></tr>
<tr><td>2012/0267680 A1</td><td>10/2012</td><td>Oya et al.</td></tr>
<tr><td>2013/0037853 A1*</td><td>2/2013</td><td>Onozawa .......... H01L 29/0661<br>257/139</td></tr>
<tr><td>2013/0175574 A1*</td><td>7/2013</td><td>Matsuura .......... H01L 29/66348<br>257/139</td></tr>
<tr><td>2013/0256744 A1*</td><td>10/2013</td><td>Tang ................ H01L 29/7397<br>257/139</td></tr>
<tr><td>2014/0003109 A1*</td><td>1/2014</td><td>Shiraishi .......... H01L 29/407<br>363/131</td></tr>
<tr><td>2014/0048872 A1*</td><td>2/2014</td><td>Hsieh .............. H01L 29/7827<br>257/331</td></tr>
<tr><td>2014/0054644 A1*</td><td>2/2014</td><td>Hikasa ............. H01L 29/7395<br>257/139</td></tr>
<tr><td>2014/0124830 A1*</td><td>5/2014</td><td>Rahimo ............ H01L 29/0696<br>257/139</td></tr>
<tr><td>2014/0124831 A1*</td><td>5/2014</td><td>Rahimo ............ H01L 29/0696<br>257/139</td></tr>
<tr><td>2014/0187031 A1*</td><td>7/2014</td><td>Sung ............... H01L 21/82382<br>438/589</td></tr>
<tr><td>2014/0197876 A1*</td><td>7/2014</td><td>Laven .............. H01L 29/66325<br>327/375</td></tr>
<tr><td>2014/0357048 A1*</td><td>12/2014</td><td>Meiser ............. H01L 29/407<br>438/424</td></tr>
<tr><td>2015/0060937 A1*</td><td>3/2015</td><td>Hikasa ............ H01L 29/7397<br>257/139</td></tr>
<tr><td>2015/0129927 A1*</td><td>5/2015</td><td>Sumitomo ......... H01L 29/4236<br>257/139</td></tr>
<tr><td>2015/0263150 A1*</td><td>9/2015</td><td>Matsudai .......... H01L 29/7397<br>257/139</td></tr>
<tr><td>2015/0279985 A1*</td><td>10/2015</td><td>Philippou ......... H01L 29/1095<br>257/334</td></tr>
<tr><td>2015/0325558 A1*</td><td>11/2015</td><td>Hikasa ............ H01L 29/16<br>257/49</td></tr>
<tr><td>2015/0325687 A1*</td><td>11/2015</td><td>Baburske .......... H01L 29/0696<br>257/139</td></tr>
<tr><td>2015/0325688 A1*</td><td>11/2015</td><td>Baburske .......... H01L 29/7393<br>257/139</td></tr>
<tr><td>2015/0349103 A1*</td><td>12/2015</td><td>Onozawa .......... H01L 29/7397<br>257/144</td></tr>
<tr><td>2016/0020290 A1</td><td>1/2016</td><td>Kitagawa</td></tr>
<tr><td>2016/0043206 A1*</td><td>2/2016</td><td>Ikegami ........... H01L 29/7397<br>257/139</td></tr>
<tr><td>2016/0079238 A1*</td><td>3/2016</td><td>Siemieniec ....... H01L 29/7396<br>257/140</td></tr>
<tr><td>2016/0181417 A1*</td><td>6/2016</td><td>Kampen ........... H01L 29/7813<br>257/331</td></tr>
<tr><td>2016/0190123 A1*</td><td>6/2016</td><td>Laven ............. H01L 29/42368<br>257/140</td></tr>
<tr><td>2016/0211257 A1*</td><td>7/2016</td><td>Yoshida ........... H01L 29/42368</td></tr>
<tr><td>2016/0284824 A1*</td><td>9/2016</td><td>Nagata ............ H01L 21/76895</td></tr>
<tr><td>2017/0047444 A1*</td><td>2/2017</td><td>Tanaka ............ H01L 29/4916</td></tr>
<tr><td>2017/0069741 A1*</td><td>3/2017</td><td>Na ................. H01L 29/7397</td></tr>
<tr><td>2017/0077004 A1</td><td>3/2017</td><td>Onozawa</td></tr>
<tr><td>2017/0110573 A1*</td><td>4/2017</td><td>Laforet ............ H01L 21/02164</td></tr>
<tr><td>2017/0141103 A1*</td><td>5/2017</td><td>Kameyama ........ H01L 29/78</td></tr>
<tr><td>2017/0170273 A1*</td><td>6/2017</td><td>Naito .............. H01L 27/0664</td></tr>
<tr><td>2017/0271488 A1*</td><td>9/2017</td><td>Udrea ............. H01L 29/7397</td></tr>
<tr><td>2017/0317175 A1*</td><td>11/2017</td><td>Naito .............. H01L 27/0664</td></tr>
<tr><td>2017/0345905 A1*</td><td>11/2017</td><td>Siemieniec ....... H01L 29/04</td></tr>
</table>

(56) References Cited

U.S. PATENT DOCUMENTS

| | | | | |
|---|---|---|---|---|
| 2018/0083101 A1* | 3/2018 | Kudo | ............... | H01L 29/78 |
| 2018/0083132 A1* | 3/2018 | Dainese | ............... | H01L 21/0273 |
| 2018/0190649 A1* | 7/2018 | Laven | ............... | H01L 27/0635 |
| 2018/0190805 A1* | 7/2018 | Liu | ............... | H01L 29/423 |
| 2018/0323294 A1* | 11/2018 | Okuda | ............... | H01L 29/739 |
| 2018/0342604 A1* | 11/2018 | Ogura | ............... | H01L 29/7397 |
| 2018/0358449 A1* | 12/2018 | Zeng | ............... | H01L 29/66068 |

FOREIGN PATENT DOCUMENTS

| | | |
|---|---|---|
| CN | 103748685 A | 4/2014 |
| CN | 104183634 A | 12/2014 |
| CN | 104916672 A | 9/2015 |
| CN | 105226090 A | 1/2016 |
| DE | 102005019178 A1 | 11/2006 |
| JP | H09331063 A | 12/1997 |
| JP | 2004153112 A | 5/2004 |
| JP | 2008283112 A | 11/2008 |
| JP | 2013120809 A | 6/2013 |
| JP | 2015038954 A | 2/2015 |
| JP | 2017059672 A | 3/2017 |

OTHER PUBLICATIONS

The Japanese First Office Action dated Feb. 1, 2019 along with the English Translation.

* cited by examiner

INSULATED GATE BIPOLAR TRANSISTOR AND PREPARATION METHOD THEREFOR

This application is National Stage application of PCT international patent application PCT/CN2016/086751, filed on Jun. 22, 2016 which claims the priority to Chinese Patent Application No. 201510760338.1, titled "INSULATED GATE BIPOLAR TRANSISTOR AND PREPARATION METHOD THEREFOR", filed on Nov. 10, 2015 with the State Intellectual Property Office of People's Republic of China, both of which are incorporated herein by reference in their entireties.

FIELD

The present disclosure relates to the technical field of insulated gate bipolar transistor (IGBT), and in particular to an insulated gate bipolar transistor and a method for fabricating an insulated gate bipolar transistor.

BACKGROUND

An insulated gate bipolar transistor has advantages of a low on-state voltage drop, a great current capacity, a high input impedance, a fast response speed and simple control. Therefore, the insulated gate bipolar transistor is widely applied to the fields of industry, information, new energy, medical science, transportation and so on.

Reference is made to FIG. 1, which is a schematic structural diagram of a trench gate type IGBT chip according to the conventional technology. A cell of an existing trench gate type IGBT chip includes two primary trench gates 1. A source region 2 and an emitter metal electrode 3 are arranged oppositely between the two primary trench gates, and the emitter metal electrode 3 extends to a P-base region. The existing trench gate type IGBT chip has a low turn-off speed, and thus the performance of the IGBT chip is affected.

SUMMARY

In view of this, an insulated gate bipolar transistor is provided according to the present disclosure. By arranging an auxiliary trench gate below an emitter metal electrode located between a first primary trench and a second primary trench, a carrier path is provided when the insulated gate bipolar transistor is turned off. In this way, not only the turn-off speed of the insulated gate bipolar transistor is increased, but also the reverse-biased safety operating area characteristic of the insulated gate bipolar transistor is improved, thereby improving the performance of the insulated gate bipolar transistor.

To achieve the above objective, the following technical solutions are provided according to the present disclosure.

An insulated gate bipolar transistor including at least one cell is provided, where the cell includes:
  a drift region;
  a base region located on a surface of the drift region;
  a first primary trench, a second primary trench and an auxiliary trench located at a side of the base region away from the drift region, where the auxiliary trench is located between the first primary trench and the second primary trench, the first primary trench, the second primary trench and the auxiliary trench all extend to the drift region, a first primary gate layer is arranged in the first primary trench, a second primary gate layer is arranged in the second primary trench, an auxiliary gate layer is arranged in the auxiliary trench, and a first gate oxide layer is arranged between an inner wall of the first primary trench and the first primary gate layer, between an inner wall of the second primary trench and the second primary gate layer, and between an inner wall of the auxiliary trench and the auxiliary gate layer;
  an emitter metal electrode and an auxiliary gate layer extraction electrode located between the first primary trench and the second primary trench and located at a side of the auxiliary gate layer away from the drift region, where the emitter metal electrode extends to the base region, and an auxiliary gate oxide layer is arranged between the emitter metal electrode and the auxiliary gate layer; and
  a first source region located between the first primary trench and the emitter metal electrode and located at a side of the base region away from the drift region, and a second source region located between the second primary trench and the emitter metal electrode and located at a side of the base region away from the drift region, where neither the first source region nor the second source region is in contact with the auxiliary trench.

Preferably, the insulated gate bipolar transistor further includes:
  at least one first virtual trench located at a side of the base region away from the drift region and located at a side of the first primary trench away from the auxiliary trench;
  a first virtual gate layer arranged in the first virtual trench; and
  a second gate oxide layer arranged between an inner wall of the first virtual trench and the first virtual gate layer.

Preferably, the insulated gate bipolar transistor further includes:
  at least one second virtual trench located at a side of the base region away from the drift region and located at a side of the second primary trench away from the auxiliary trench;
  a second virtual gate layer arranged in the second virtual trench; and
  a third gate oxide layer arranged between an inner wall of the second virtual trench and the second virtual gate layer.

Preferably, the insulated gate bipolar transistor further includes: a well region located between the base region and the drift region.

Preferably, a distance between the first primary trench and the auxiliary trench is the same as a distance between the second primary trench and the auxiliary trench.

Preferably, a depth of the first primary trench extending to the drift region, a depth of the second primary trench extending to the drift region, and a depth of the auxiliary trench extending to the drift region are the same.

Preferably, a width of the first primary trench, a width of the second primary trench, and a width of the auxiliary trench are the same.

Preferably, the first primary gate layer, the second primary gate layer and the auxiliary gate layer are all polysilicon gate layers.

A method for fabricating an insulated gate bipolar transistor is further provided according to the present disclosure. The method includes:
  providing a substrate, where the substrate includes a drift region and a base region located on a surface of the drift region;

preparing a first primary trench, a second primary trench and an auxiliary trench at a side of the base region away from the drift region, preparing a first gate oxide layer at inner walls of the first primary trench, the second primary trench and the auxiliary trench, filling the first primary trench with a first primary gate layer, filling the second primary trench with a second primary gate layer, and filling the auxiliary trench with an auxiliary gate layer, where the auxiliary trench is located between the first primary trench and the second primary trench, and the first primary trench, the second primary trench and the auxiliary trench all extend to the drift region;

preparing a first source region between the first primary trench and the auxiliary trench, and preparing a second source region between the second primary trench and the auxiliary trench;

preparing an emitter metal electrode window between the first source region and the second source region, and preparing an auxiliary gate oxide layer on a surface of a side of the auxiliary gate layer away from the drift region, that is located at the emitter metal electrode window, where two side edges of the emitter metal electrode window are in contact with the first source region and the second source region respectively and extend to the base region; and preparing an emitter metal electrode inside the emitter metal electrode window, and preparing an auxiliary gate layer extraction electrode on a surface of a side of the auxiliary gate layer away from the drift region, that is located outside the emitter metal electrode window.

Preferably, when preparing an emitter metal electrode window between the first source region and the second source region, the method further includes:

preparing an auxiliary gate layer extraction electrode window at a side of the auxiliary gate layer away from the drift region, that is located outside the emitter metal electrode window, where the auxiliary gate layer extraction electrode window covers the auxiliary trench and the auxiliary gate layer extraction electrode is prepared at the auxiliary gate layer extraction electrode window.

As compared with the conventional technology, technical solutions provided by the present disclosure have at least the following advantages.

An insulated gate bipolar transistor and a method for fabricating an insulated gate bipolar transistor are provided according to the present disclosure. The transistor includes at least one cell. The cell includes: a drift region; a base region located on a surface of the drift region; a first primary trench, a second primary trench and an auxiliary trench located at a side of the base region away from the drift region, where the auxiliary trench is located between the first primary trench and the second primary trench, the first primary trench, the second primary trench and the auxiliary trench all extend to the drift region, a first primary gate layer is arranged in the first primary trench, a second primary gate layer is arranged in the second primary trench, an auxiliary gate layer is arranged in the auxiliary trench, and a first gate oxide layer is arranged between an inner wall of the first primary trench and the first primary gate layer, between an inner wall of the second primary trench and the second primary gate layer, and between an inner wall of the auxiliary trench and the auxiliary gate layer; an emitter metal electrode and an auxiliary gate layer extraction electrode located between the first primary trench and the second primary trench and located at a side of the auxiliary gate layer away from the drift region, where the emitter metal electrode extends to the base region, and an auxiliary gate oxide layer is arranged between the emitter metal electrode and the auxiliary gate layer; and a first source region located between the first primary trench and the emitter metal electrode and located at a side of the base region away from the drift region, and a second source region located between the second primary trench and the emitter metal electrode and located at a side of the base region away from the drift region, where neither the first source region nor the second source region is in contact with the auxiliary trench.

It follows that, according to the technical solutions provided by the present disclosure, an auxiliary trench gate (that is, a structure including an auxiliary trench, an auxiliary gate layer and a corresponding gate oxide layer) is arranged below an emitter metal electrode located between the first primary trench and the second primary trench, to provide a carrier path when the insulated gate bipolar transistor is turned off. Therefore, not only the turn-off speed of the insulated gate bipolar transistor is increased, but also the reverse-biased safety operating area characteristic of the insulated gate bipolar transistor is improved, thereby improving the performance of the insulated gate bipolar transistor.

BRIEF DESCRIPTION OF THE DRAWINGS

The drawings to be used in the description of embodiments of the present disclosure or the conventional technology are described briefly as follows, so that technical solutions according to the embodiments of the present disclosure or the conventional technology may become clearer. Apparently, the drawings in the following description only illustrate some embodiments of the present disclosure. For those skilled in the art, other drawings may be obtained based on these drawings without any creative work.

DETAILED DESCRIPTION OF THE EMBODIMENTS

The technical solutions according to embodiments of the present disclosure will be described clearly and completely as follows in conjunction with the accompany drawings in the embodiments of the present disclosure. Apparently, the described embodiments are only a part rather than all of the embodiments according to the present disclosure. All the other embodiments obtained by those skilled in the art based on the embodiments in the present disclosure without any creative work fall within the scope of protection of the present disclosure.

As described in the background, the existing insulated gate bipolar transistor has a low turn-off speed, thereby affecting the performance of the transistor.

Based on this, an insulated gate bipolar transistor and a method for fabricating an insulated gate bipolar transistor are provided according to embodiments of the present disclosure. An auxiliary trench gate is arranged below an emitter metal electrode located between a first primary trench and a second primary trench, to provide a carrier path when the insulated gate bipolar transistor is turned off. Therefore, not only the turn-off speed of the insulated gate bipolar transistor is increased, but also the reverse-biased safety operating area characteristic of the insulated gate bipolar transistor is improved, thereby improving the performance of the insulated gate bipolar transistor. To attain the objective, technical solutions provided by embodiments of the present disclosure are described as follows. The technical solutions according to embodiments of the present disclosure will be described in detail in conjunction with FIGS. 2 to 5d.

It should be illustrated that, the insulated gate bipolar transistor is described by taking an N-type base material as an example in the following embodiments of the present disclosure. That is, the drift region is an N-drift region, the base region is a P-base region, and the source region is an N+ source region.

Figure 1:
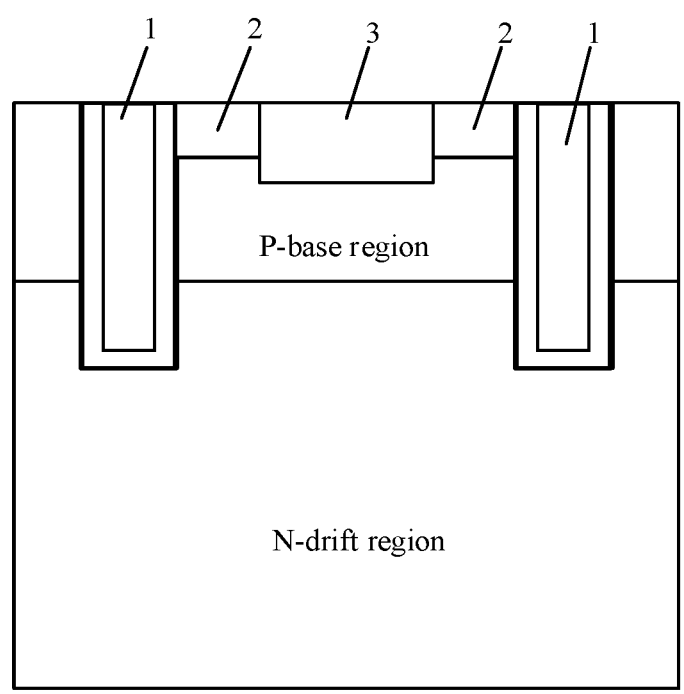
FIG. 1 is a schematic structural diagram of a trench gate type IGBT chip according to the conventional technology.
Figure 2:
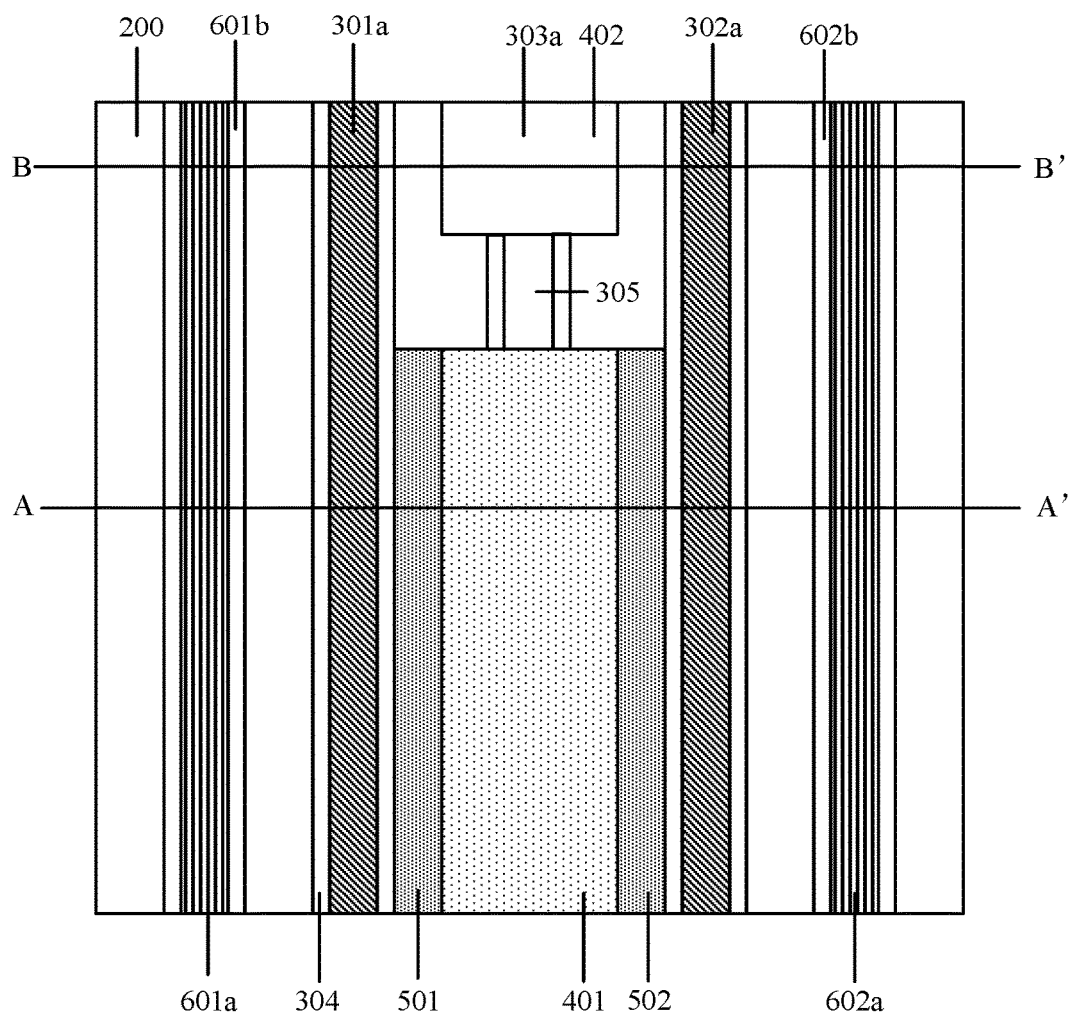
FIG. 2 is a top view of an insulated gate bipolar transistor according to an embodiment of the present disclosure.
Figure 3A:
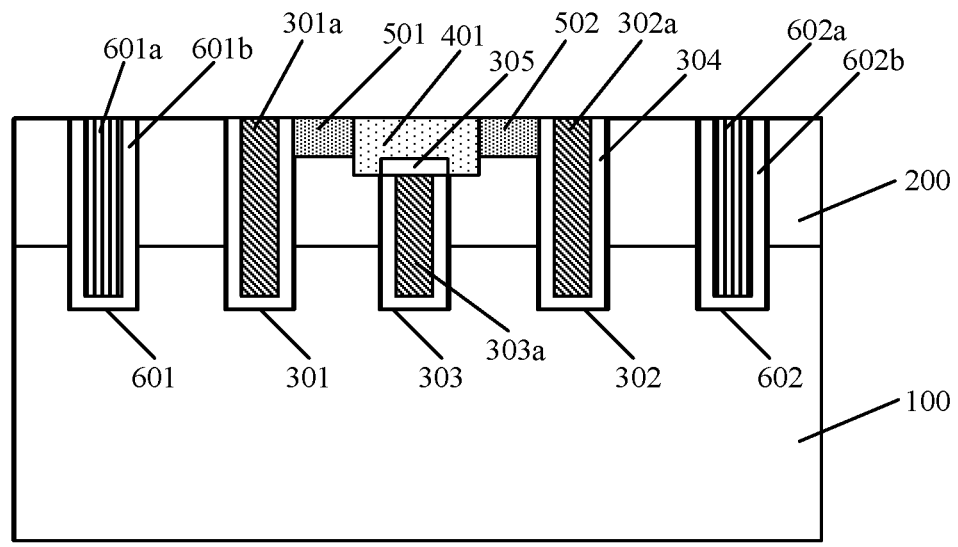
FIG. 3a is a sectional drawing of FIG. 2 along A-A' direction.
Figure 3B:
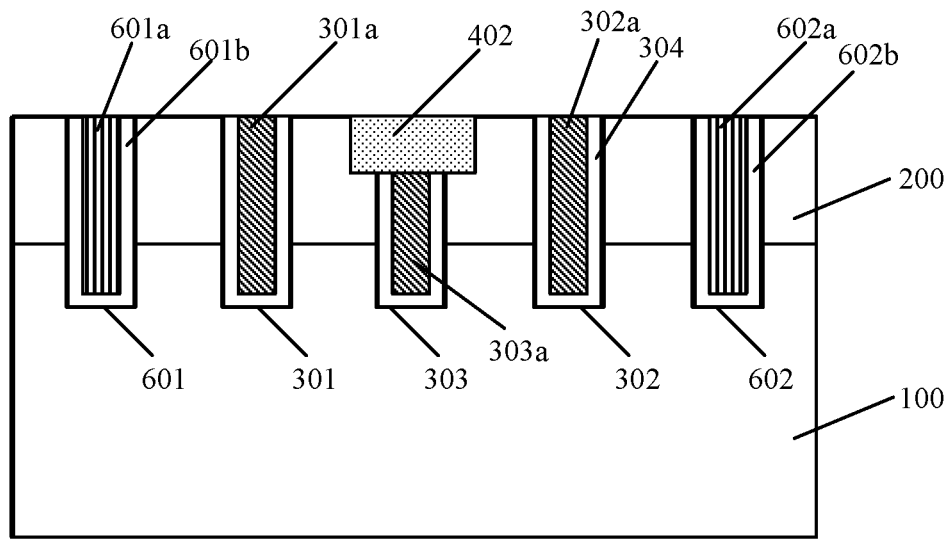
FIG. 3b is a sectional drawing of FIG. 2 along B-B' direction.

Specifically, reference is made to FIGS. 2, 3a and 3b, in which, FIG. 2 is a top view of an insulated gate bipolar transistor according to an embodiment of the present disclosure, FIG. 3a is a sectional drawing of FIG. 2 along A-A' direction, and FIG. 3b is a sectional drawing of FIG. 2 along B-B' direction. The insulated gate bipolar transistor includes at least one cell, and the cell includes:

a drift region 100;

a base region 200 located on a surface of the drift region 100;

a first primary trench 301, a second primary trench 302 and an auxiliary trench 303 located at a side of the base region 200 away from the drift region 100, where the auxiliary trench 303 is located between the first primary trench 301 and the second primary trench 302, the first primary trench 301, the second primary trench 302 and the auxiliary trench 303 all extend to the drift region 200, a first primary gate layer 301a is arranged in the first primary trench 301, a second primary gate layer 302a is arranged in the second primary trench 302, an auxiliary gate layer 303a is arranged in the auxiliary trench 303, and a first gate oxide layer 304 is arranged between an inner wall of the first primary trench 301 and the first primary gate layer 301a, between an inner wall of the second primary trench 302 and the second primary gate layer 302a, and between an inner wall of the auxiliary trench 303 and the auxiliary gate layer 303a;

an emitter metal electrode 401 and an auxiliary gate layer extraction electrode 402 located between the first primary trench 301 and the second primary trench 302 and located at a side of the auxiliary gate layer 303a away from the drift region 200, where the emitter metal electrode 401 extends to the base region 200, and an auxiliary gate oxide layer 305 is arranged between the emitter metal electrode 401 and the auxiliary gate layer 303a; and a first source region 501 located between the first primary trench 301 and the emitter metal electrode 401 and located at a side of the base region 200 away from the drift region 100, and a second source region 502 located between the second primary trench 302 and the emitter metal electrode 401 and located at a side of the base region 200 away from the drift region 100, where neither the first source region 501 nor the second source region 502 is in contact with the auxiliary trench 303.

It should be noted that, the insulated gate bipolar transistor provided by the embodiment of the present disclosure further includes a collector region, a collector metal electrode and other structures that are the same as components in the conventional technology, which will not be described here.

According to the insulated gate bipolar transistor provided by the above embodiment of the present disclosure, the auxiliary gate layer extraction electrode is in contact with the auxiliary gate layer, functioning as a connection electrode of the auxiliary gate layer. The auxiliary gate oxide layer is arranged at an interface between the auxiliary gate layer and the emitter metal electrode to avoid contact between the auxiliary gate layer and the emitter metal electrode. The auxiliary gate oxide layer totally covers the interface between the emitter metal electrode and the auxiliary gate layer. Alternatively, the auxiliary gate oxide layer not only totally covers the interface between the emitter metal electrode and the auxiliary gate layer, but also extends to cover edges of the auxiliary gate layer extraction electrode. Additionally, sizes of the emitter metal electrode, the source region and the auxiliary gate layer extraction electrode and the extension length of the auxiliary gate oxide layer are not limited by embodiments of the present disclosure, and may be designed specifically according to the actual situations.

Figure 3C:
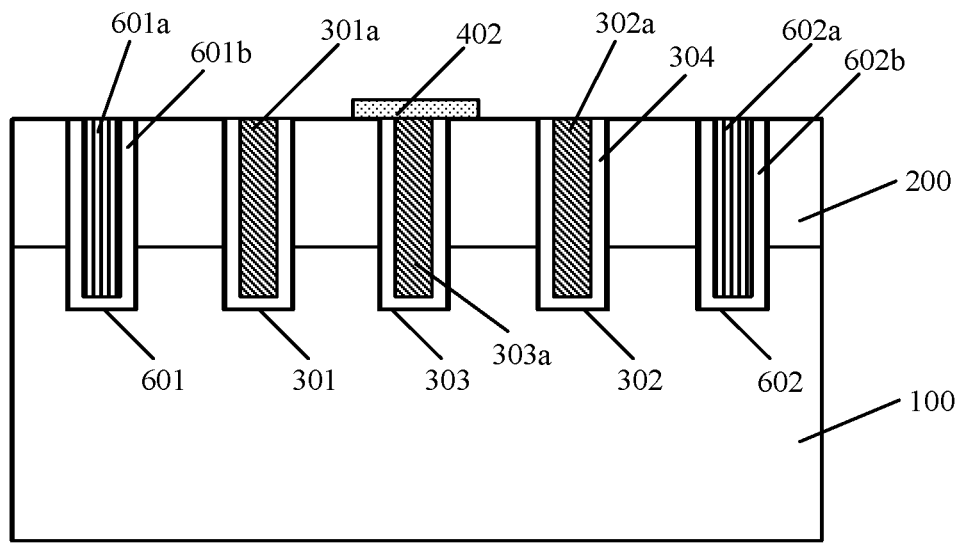
FIG. 3c is another sectional drawing of FIG. 2 along the B-B' direction.

Specifically, to avoid an increase in a volume of the insulated gate bipolar transistor due to arranging the auxiliary gate layer extraction electrode, an auxiliary gate layer extraction electrode window may be formed by etching in a region above the auxiliary trench, and then an auxiliary gate layer extraction electrode may be prepared at the window. As shown in FIG. 3b, the auxiliary gate layer extraction electrode 402 is located in the base region 200. Alternatively, as shown in FIG. 3c, the auxiliary gate layer extraction electrode 402 may also be located outside a side of the base region 200 away from the drift region 100, which is not limited by the embodiments of the present disclosure.

Furthermore, to improve the performance of the insulated gate bipolar transistor, the insulated gate bipolar transistor provided by the embodiment of the present disclosure further includes multiple virtual gate structures. As shown in FIGS. 2 to 3b, the insulated gate bipolar transistor further includes:

at least one first virtual trench 601 located at a side of the base region 200 away from the drift region 100 and located at a side of the first primary trench 301 away from the auxiliary trench 303;

a first virtual gate layer 601a arranged in the first virtual trench 601; and a second gate oxide layer 601b arranged between an inner wall of the first virtual trench 601 and the first virtual gate layer 601a.

As shown in FIGS. 2 to 3b, the insulated gate bipolar transistor further includes:

at least one second virtual trench 602 located at a side of the base region 200 away from the drift region 100 and located at a side of the second primary trench 302 away from the auxiliary trench 303;

a second virtual gate layer 602a arranged in the second virtual trench 602; and a third gate oxide layer 602b arranged between an inner wall of the second virtual trench 602 and the second virtual gate layer 602a.

It should be noted that, the number of first virtual trench gates (that is, structures including the first virtual trench, the first virtual gate layer and the second gate oxide layer) and the number of second virtual trench gates (that is, structures including the second virtual trench, the second virtual gate layer and the third gate oxide layer) are not limited by the embodiments of the present disclosure, which may be designed specifically according to the actual situations.

Figure 3D:
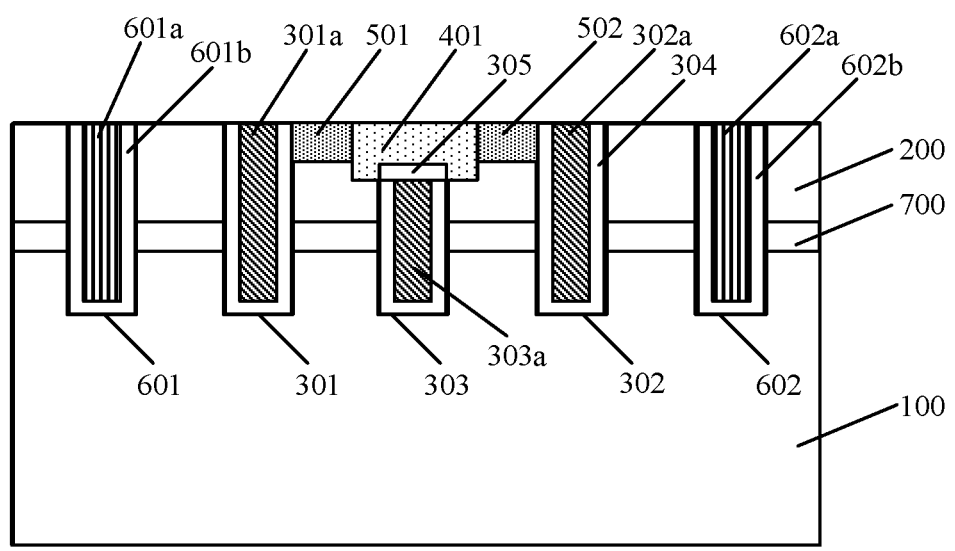
FIG. 3d is another sectional drawing of FIG. 2 along the A-A' direction.

Furthermore, reference is made to FIG. 3d, which is another sectional drawing of FIG. 2 along A-A' direction. In order to further improve the performance of the insulated gate bipolar transistor, the insulated gate bipolar transistor further includes:

a well region 700 located between the base region 200 and the drift region 100. The primary trenches, the virtual trenches and the auxiliary trench are all through the well region and extend to the drift region. Since the drift region is the N-drift region, and the well region is an N well region.

Figure 4:
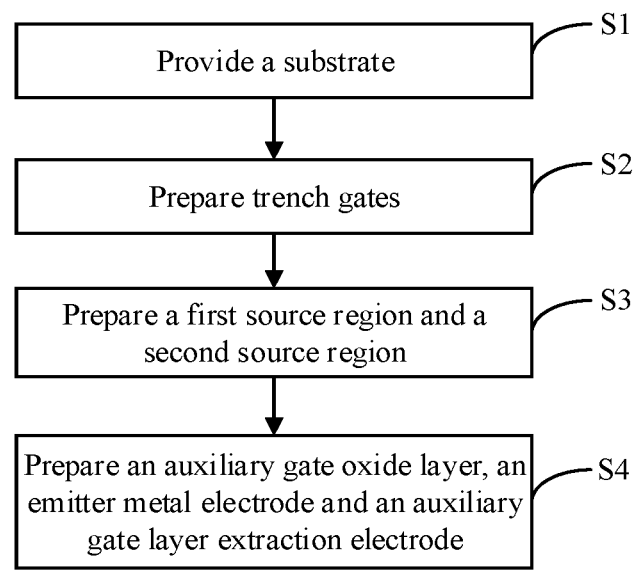
FIG. 4 is a flow chart of a method for fabricating an IGBT chip according to an embodiment of the present disclosure.

A method for fabricating an insulated gate bipolar transistor according to embodiments of the present disclosure is described hereinafter in conjunction with FIGS. 4 to 5d. Reference is made to FIG. 4, which is a flow chart of a method for fabricating an insulated gate bipolar transistor according to an embodiment of the present disclosure. The method for fabricating the insulated gate bipolar transistor includes the following steps S1 to S4.

In step S1, a substrate is provided.

The substrate is provided, and the substrate includes a drift region and a base region located on a surface of the drift region.

Figure 5A:
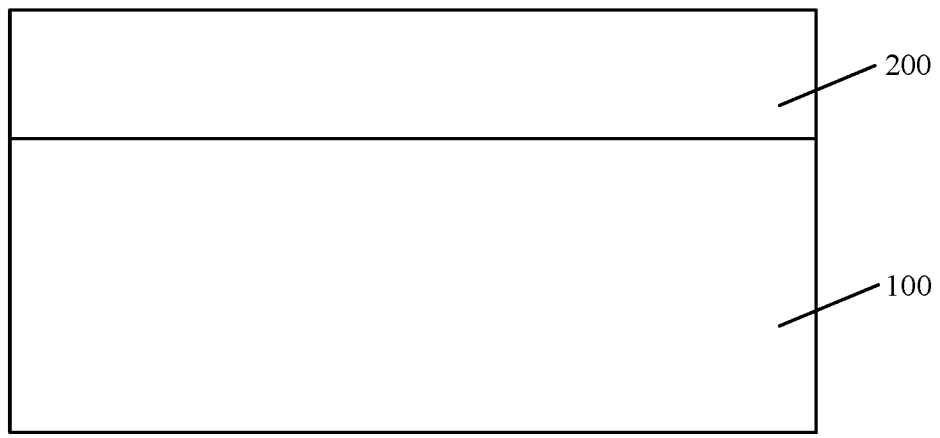
FIGS. 5a to 5d are structural flow charts corresponding to a method for fabricating an insulated gate bipolar transistor according to an embodiment of the present disclosure.

As shown in FIG. 5a, the substrate includes an N-drift region 100 and a P-base region 200. Furthermore, the substrate may further include a well region (not shown in FIG. 5a) located between the base region and the drift region.

In step S2, trench gates are prepared.

A first primary trench, a second primary trench and an auxiliary trench are prepared at a side of the base region away from the drift region. The first primary trench is filled with a first primary gate layer, the second primary trench is filled with a second primary gate layer, and the auxiliary trench is filled with an auxiliary gate layer, after a first gate oxide layer is prepared at inner walls of the first primary trench, the second primary trench and the auxiliary trench. The auxiliary trench is located between the first primary trench and the second primary trench. The first primary trench, the second primary trench and the auxiliary trench all extend to the drift region.

Figure 5B:
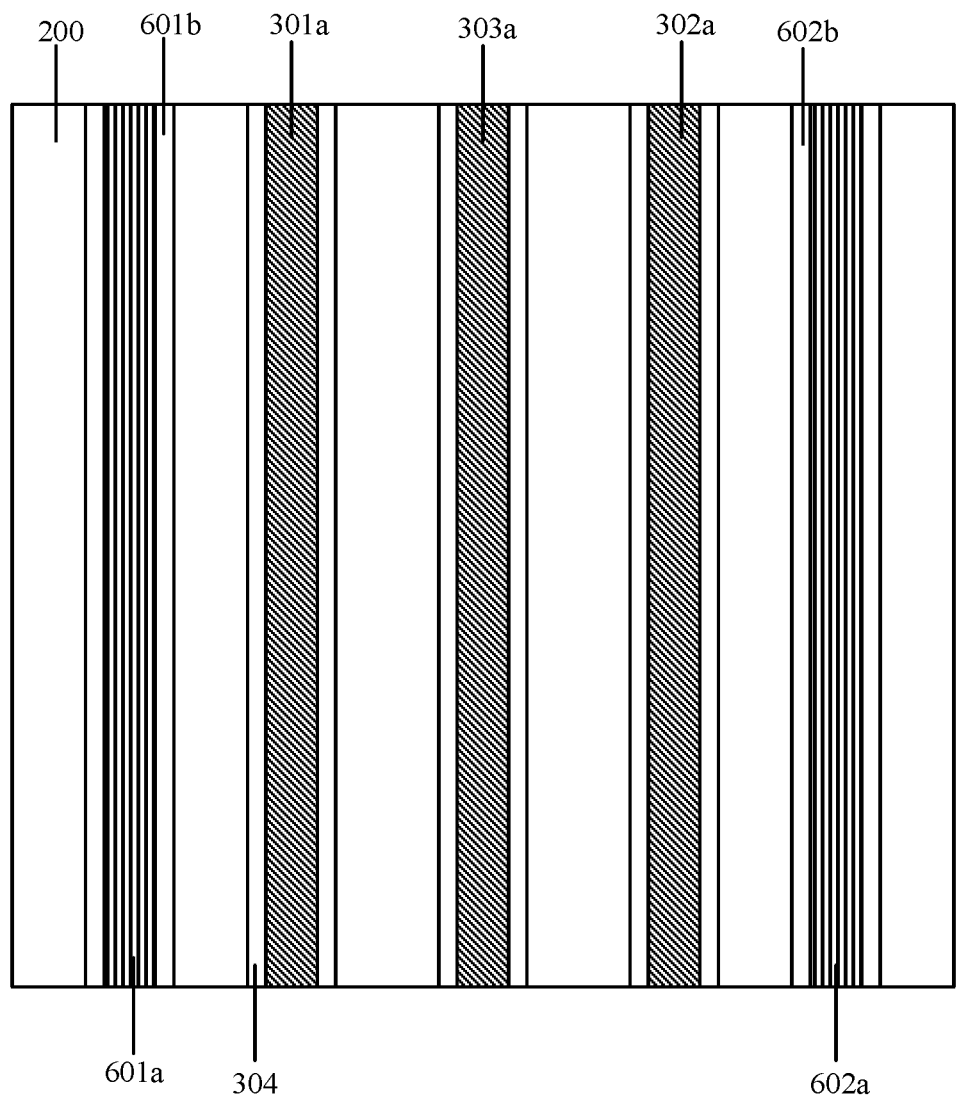

As shown in FIG. 5b, the trench gates are prepared in the P-base region 200 through the processes of etching, filling and so on. The trench gates include a first primary trench gate (that is, the first primary trench 301, the first primary gate layer 301a and the corresponding first gate oxide layer 304), a second primary trench gate (that is, the second primary trench 302, the second primary gate layer 302a and the corresponding first gate oxide layer 304) and an auxiliary trench gate (that is, the auxiliary trench 303, the auxiliary gate layer 303a and the corresponding first gate oxide layer 304).

In addition, to improve the performance of the insulated gate bipolar transistor, a first virtual trench gate (that is, the first virtual trench 601, the first virtual gate layer 601a and the second gate oxide layer 601b) and a second virtual trench gate (that is, the second virtual trench 602, the second virtual gate layer 602a and the third gate oxide layer 602b) may be further prepared.

In step S3, a first source region and a second source region are prepared.

The first source region is prepared between the first primary trench and the auxiliary trench. The second source region is prepared between the second primary trench and the auxiliary trench.

Figure 5C:
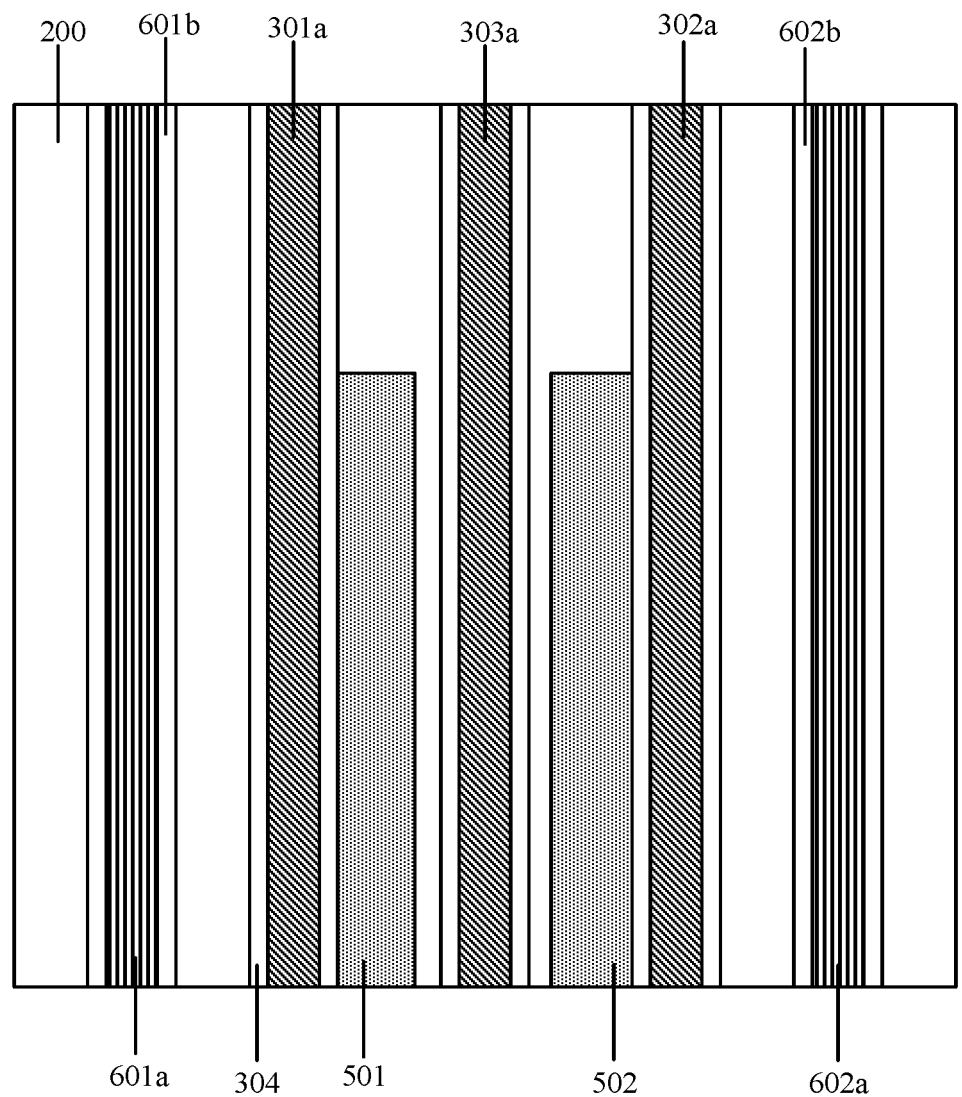

As shown in FIG. 5c, the first source region 501 and the second source region 502 are prepared at positions in the P-base region located between the first primary trench gate and the second primary trench gate by adopting the processes of doping, high-temperature propulsion and so on. The first source region is arranged oppositely to the second source region. The first source region is arranged in a region between the first primary trench and the auxiliary trench. The second source region is arranged in a region between the second primary trench and the auxiliary trench.

It should be noted that, the first source region and the second source region prepared in step S3 are not final two source regions in the insulated gate bipolar transistor, and the subsequent process of partial etching is performed on the first source region and the second source region to obtain a final first source region and a final second source region.

In step S4, an auxiliary gate oxide layer, an emitter metal electrode and an auxiliary gate layer extraction electrode are prepared.

An emitter metal electrode window is prepared between the first source region and the second source region. The auxiliary gate oxide layer is prepared on a surface of a side of the auxiliary gate layer away from the drift region, that is located at the emitter metal electrode window. The emitter metal electrode is prepared in the emitter metal electrode window. The auxiliary gate layer extraction electrode is prepared on a surface of a side of the auxiliary gate layer away from the drift region, that is located outside the emitter metal electrode window. Two side edges of the emitter metal electrode window are in contact with the first source region and the second source region respectively and extend to the base region.

Figure 5D:
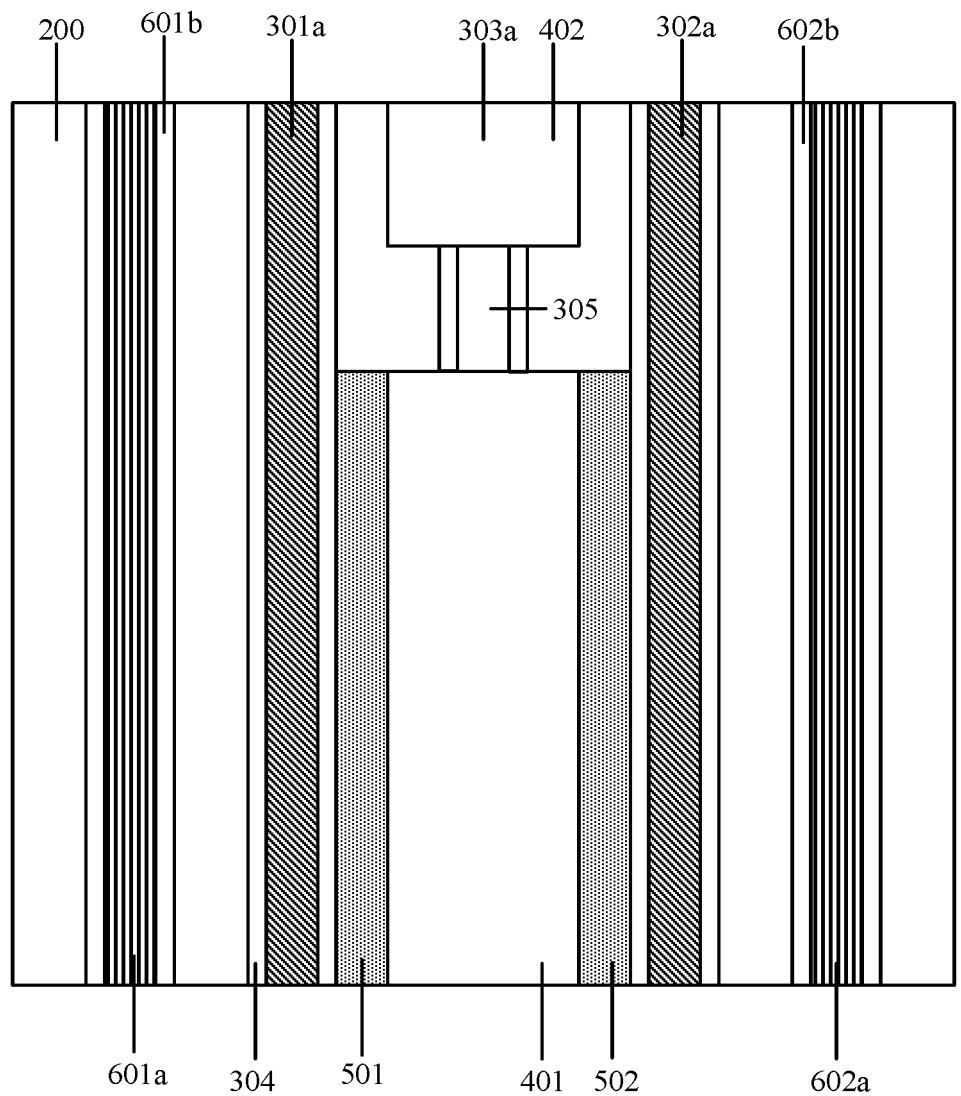

As shown in FIG. 5d, the process of etching and so on is performed on a part of the region above the auxiliary trench gate to prepare the emitter metal electrode window. Subsequently, the auxiliary gate oxide layer 305 is formed at a position in the auxiliary gate layer 303a corresponding to the emitter metal electrode window. The auxiliary gate oxide layer 305 may extend to the edges of the auxiliary gate layer extraction electrode 402. After the auxiliary gate oxide layer 305 is prepared, the emitter metal electrode 401 is prepared at the emitter metal electrode window, and the auxiliary gate layer extraction electrode 402 is prepared on a surface of a side of the auxiliary gate layer 303a away from the drift region, that is located outside the emitter metal electrode window. The emitter metal electrode 401 and the auxiliary gate layer extraction electrode 402 are mutually isolated.

In addition, according to the method provided by the embodiments of the present disclosure, not only the auxiliary gate layer extraction electrode is prepared on the surface of the auxiliary gate layer directly, but also an auxiliary gate layer extraction electrode window is formed by etching in the region, to prepare the auxiliary gate layer extraction electrode. That is, when preparing the emitter metal electrode window between the first source region and the second source region, the method further includes:

preparing an auxiliary gate layer extraction electrode window at a side of the auxiliary gate layer away from the drift region, that is located outside the emitter metal electrode window, where the auxiliary gate layer extraction electrode window covers the auxiliary trench, and the auxiliary gate layer extraction electrode is prepared at the auxiliary gate layer extraction electrode window.

Optionally, a width of the emitter metal electrode is greater than two times of a width of the auxiliary trench.

In all the above embodiments, a distance between the first primary trench and the auxiliary trench is the same as a distance between the second primary trench and the auxiliary trench. If the insulated gate bipolar transistor further includes virtual trench gates, a distance between the virtual trench and the primary trench, a distance between the primary trench and the auxiliary trench, and a distance between the virtual trenches at the same side are the same. Furthermore, a distance between adjacent trenches is the smallest distance that specific processing equipment can realize.

In addition, a depth of the first primary trench extending to the drift region, a depth of the second primary trench extending to the drift region, and a depth of the auxiliary trench extending to the drift region are the same.

In addition, a width of the first primary trench, a width of the second primary trench and a width of the auxiliary trench are the same.

The first primary gate layer, the second primary gate layer and the auxiliary gate layer provided by the embodiments of the present disclosure are all polysilicon gate layers. The first virtual gate layer and the second virtual gate layer may be polysilicon gate layers as well or may be made of other materials, which is not limited by the present disclosure. The auxiliary gate oxide layer, the first gate oxide layer, the second gate oxide layer and the third gate oxide layer are made of the same material and may be all silicon dioxide layers.

An insulated gate bipolar transistor and a method for fabricating an insulated gate bipolar transistor are provided according to the embodiments of the present disclosure. The transistor includes at least one cell. The cell includes: a drift region; a base region located on a surface of the drift region; a first primary trench, a second primary trench and an auxiliary trench located at a side of the base region away from the drift region, where the auxiliary trench is located between the first primary trench and the second primary trench, the first primary trench, the second primary trench and the auxiliary trench all extend to the drift region, a first primary gate layer is arranged in the first primary trench, a second primary gate layer is arranged in the second primary trench, an auxiliary gate layer is arranged in the auxiliary trench, and a first gate oxide layer is arranged between an inner wall of the first primary trench and the first primary gate layer, between an inner wall of the second primary trench and the second primary gate layer, and between an inner wall of the auxiliary trench and the auxiliary gate layer respectively; an emitter metal electrode and an auxiliary gate layer extraction electrode located between the first primary trench and the second primary trench and located at a side of the auxiliary gate layer away from the drift region, where the emitter metal electrode covers the auxiliary trench and extends to the base region, and an auxiliary gate oxide layer is arranged between the emitter metal electrode and the auxiliary gate layer; and a first source region located between the first primary trench and the emitter metal electrode and located at a side of the base region away from the drift region, and a second source region located between the second primary trench and the emitter metal electrode and located at a side of the base region away from the drift region, where neither the first source region nor the second source region is in contact with the auxiliary trench.

It follows that, according to the technical solutions provided by the embodiments of the present disclosure, an auxiliary trench gate (that is, a structure including an auxiliary trench, an auxiliary gate layer and a corresponding gate oxide layer) is arranged below the emitter metal electrode located between the first primary trench and the second primary trench, to provide a carrier path when the insulated gate bipolar transistor is turned off. Therefore, not only the turn-off speed of the insulated gate bipolar transistor is increased, but also the reverse-biased safety operating area characteristic of the insulated gate bipolar transistor is improved, thereby improving the performance of the insulated gate bipolar transistor.

The above description of the embodiments disclosed herein enables those skilled in the art to implement or use the present disclosure. Numerous modifications to the embodiments are apparent to those skilled in the art, and the general principles defined herein can be implemented in other embodiments without deviating from the spirit or scope of the present disclosure. Therefore, the present disclosure is not limited to the embodiments described herein, but conforms to the widest scope consistent with the principles and novel features disclosed herein.

The invention claimed is:

1. An insulated gate bipolar transistor comprising at least one cell, wherein the cell comprises:
    a drift region;
    a base region located on a surface of the drift region;
    a first primary trench, a second primary trench and an auxiliary trench located at a side of the base region away from the drift region, wherein the auxiliary trench is located between the first primary trench and the second primary trench, the first primary trench, the second primary trench and the auxiliary trench all extend to the drift region, a first primary gate layer is arranged in the first primary trench, a second primary gate layer is arranged in the second primary trench, an auxiliary gate layer is arranged in the auxiliary trench, and a first gate oxide layer is arranged between an inner wall of the first primary trench and the first primary gate layer, between an inner wall of the second primary trench and the second primary gate layer, and between an inner wall of the auxiliary trench and the auxiliary gate layer;
    an emitter metal electrode and an auxiliary gate layer extraction electrode located between the first primary trench and the second primary trench and located at a side of the auxiliary gate layer away from the drift region, wherein the emitter metal electrode extends to the base region, and an auxiliary gate oxide layer is arranged between the emitter metal electrode and the auxiliary gate layer; and
    a first source region located between the first primary trench and the emitter metal electrode and located at a side of the base region away from the drift region, and a second source region located between the second primary trench and the emitter metal electrode and located at a side of the base region away from the drift region, wherein neither the first source region nor the second source region is in contact with the auxiliary trench, and wherein upper surfaces of the first primary gate layer, the second primary gate layer, the emitter metal electrode, the first source region and the second source region are arranged in a same plane, and the auxiliary trench is arranged below the plane.

2. The insulated gate bipolar transistor according to claim 1, further comprising:
at least one first virtual trench located at a side of the base region away from the drift region and located at a side of the first primary trench away from the auxiliary trench;
a first virtual gate layer arranged in the first virtual trench; and
a second gate oxide layer arranged between an inner wall of the first virtual trench and the first virtual gate layer.

3. The insulated gate bipolar transistor according to claim 1, further comprising:
at least one second virtual trench located at a side of the base region away from the drift region and located at a side of the second primary trench away from the auxiliary trench;
a second virtual gate layer arranged in the second virtual trench; and
a third gate oxide layer arranged between an inner wall of the second virtual trench and the second virtual gate layer.

4. The insulated gate bipolar transistor according to claim 1, further comprising:
a well region located between the base region and the drift region.

5. The insulated gate bipolar transistor according to claim 1, wherein a distance between the first primary trench and the auxiliary trench is the same as a distance between the second primary trench and the auxiliary trench.

6. The insulated gate bipolar transistor according to claim 1, wherein a depth of the first primary trench extending to the drift region, a depth of the second primary trench extending to the drift region, and a depth of the auxiliary trench extending to the drift region are the same.

7. The insulated gate bipolar transistor according to claim 1, wherein a width of the first primary trench, a width of the second primary trench, and a width of the auxiliary trench are the same.

8. The insulated gate bipolar transistor according to claim 1, wherein the first primary gate layer, the second primary gate layer and the auxiliary gate layer are all polysilicon gate layers.

9. A method for fabricating an insulated gate bipolar transistor, comprising:

providing a substrate, wherein the substrate comprises a drift region and a base region located on a surface of the drift region;
preparing a first primary trench, a second primary trench and an auxiliary trench at a side of the base region away from the drift region, preparing a first gate oxide layer at inner walls of the first primary trench, the second primary trench and the auxiliary trench, filling the first primary trench with a first primary gate layer, filling the second primary trench with a second primary gate layer, and filling the auxiliary trench with an auxiliary gate layer, wherein the auxiliary trench is located between the first primary trench and the second primary trench, and the first primary trench, the second primary trench and the auxiliary trench all extend to the drift region;
preparing a first source region between the first primary trench and the auxiliary trench, and preparing a second source region between the second primary trench and the auxiliary trench;
preparing an emitter metal electrode window between the first source region and the second source region, preparing an auxiliary gate oxide layer on a surface of a side of the auxiliary gate layer away from the drift region, that is located at the emitter metal electrode window, preparing an emitter metal electrode inside the emitter metal electrode window, and preparing an auxiliary gate layer extraction electrode on a surface of a side of the auxiliary gate layer away from the drift region, that is located outside the emitter metal electrode window, wherein two side edges of the emitter metal electrode window are in contact with the first source region and the second source region respectively and extend to the base region,
wherein upper surfaces of the first primary gate layer, the second primary gate layer, the emitter metal electrode, the first source region and the second source region are arranged in a same plane, and the auxiliary trench is arranged below the plane.

10. The method for fabricating the insulated gate bipolar transistor according to claim 9, wherein when preparing the emitter metal electrode window between the first source region and the second source region, the method further comprises:
preparing an auxiliary gate layer extraction electrode window at a side of the auxiliary gate layer away from the drift region, that is located outside the emitter metal electrode window, wherein the auxiliary gate layer extraction electrode window covers the auxiliary trench and the auxiliary gate layer extraction electrode is prepared at the auxiliary gate layer extraction electrode window.

* * * * *